United States Patent [19]
Siess

[11] Patent Number: 5,780,862
[45] Date of Patent: Jul. 14, 1998

[54] METHOD AND APPARATUS FOR GENERATING IONS

[76] Inventor: Harold E. Siess, 8629 Welbeck Way, Gaithersburg, Md. 20879

[21] Appl. No.: 797,954

[22] Filed: Feb. 12, 1997

Related U.S. Application Data

[63] Continuation-in-part of Ser. No. 179,710, Jan. 11, 1994, Pat. No. 5,420,437, Ser. No. 452,487, May 30, 1995, abandoned, and Ser. No. 663,543, Jun. 13, 1996, abandoned.

[51] Int. Cl.⁶ .................................................. H01J 27/00
[52] U.S. Cl. ............................ 250/492.3; 250/423 R
[58] Field of Search ....................... 250/492.3, 423 R, 250/424, 425, 423 F

[56] References Cited

U.S. PATENT DOCUMENTS 3,864,575  2/1975  Hashmi et al. .................. 250/423 R
5,420,437  5/1995  Siess ................................ 250/492.3

*Primary Examiner*—Kiet T. Nguyen
*Attorney, Agent, or Firm*—William H. Holt

[57] ABSTRACT

A surface ion source apparatus (10) creates a high purity ion beam (44) of molecules of metal compounds having a lower ionization energy than the metal they contain. Low energy dispersion in the ion beam and currents on the order of one ampere are attainable over long duration operation. Rhenium screen (12) is used in the ion source and related catalyzer (31). Temperatures vary in the range of 700 to 2500 degrees centigrade and a preferred vacuum pressure of $10^{-5}$ torr, or lower, is used. Wear and corrosion resistance of a wide variety of materials is greatly enhanced through ion deposition and/or implantation with the disclosed apparatus and methods. This high output ion source is also useful for electronic propulsion, separation of isotopes and production of electricity by forcing ions through a transverse magnetic field, such as used with a magnetohydrodynamic generator.

30 Claims, 1 Drawing Sheet

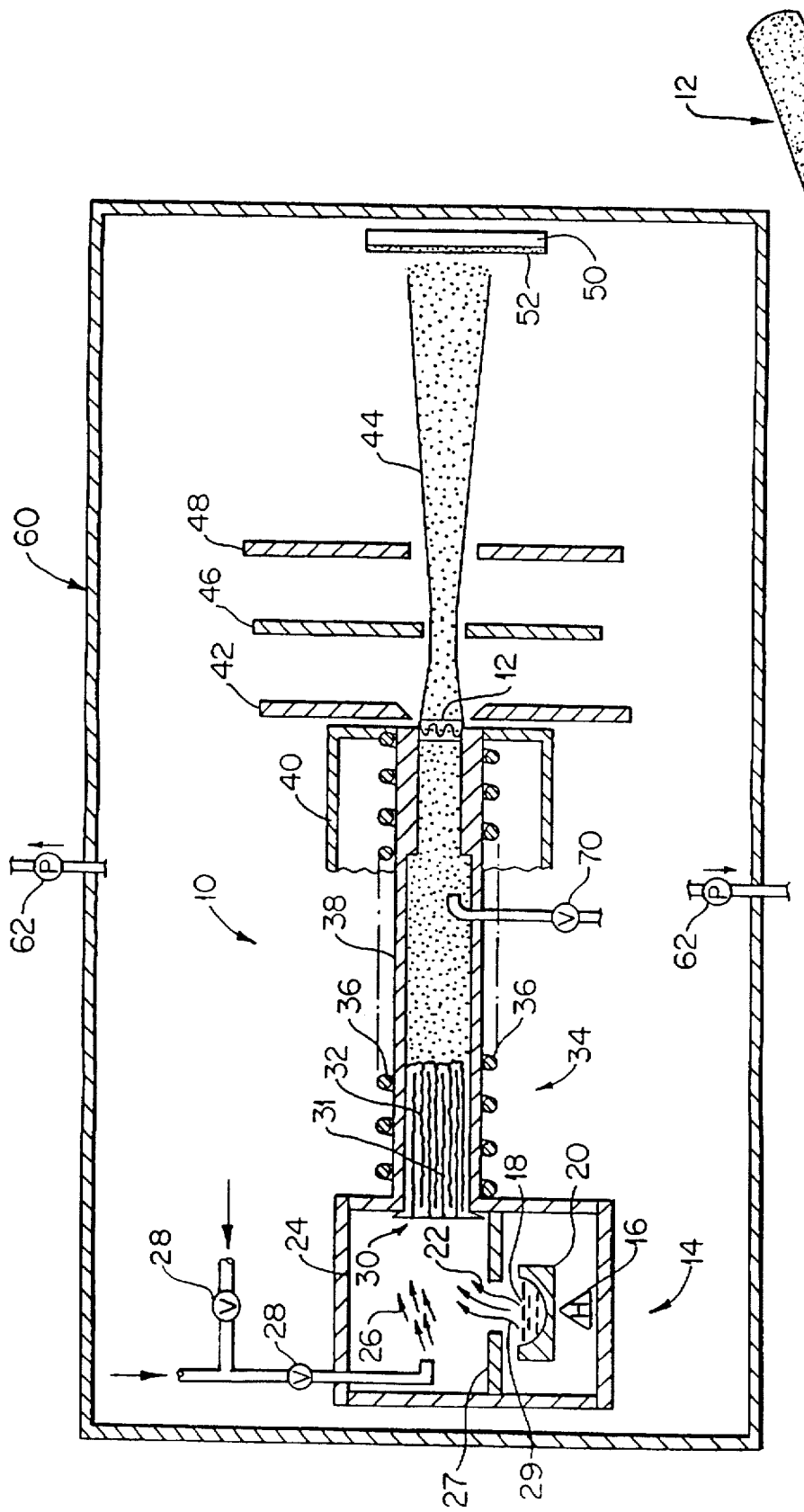
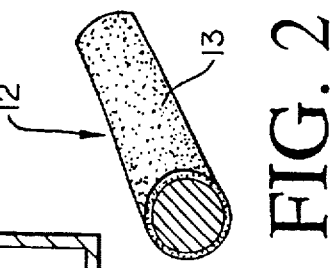
FIG. 1
FIG. 2

METHOD AND APPARATUS FOR GENERATING IONS

CROSS-REFERENCE TO RELATED APPLICATION

This is a continuation-in-part of U.S. application Ser. No. 08/179,710 filed Jan. 11, 1994, now U.S. Pat. No. 5,420,437 granted on May 30, 1995, U.S. application Ser. No. 08/452,487 filed on May 30, 1995 (now abandoned) and U.S. application Ser. No. 08/663,543 filed on Jun. 13, 1996 (now abandoned).

This invention relates to the generation and implantation of ions and more particularly to new and improved methods and apparatus wherein a surface ionization ion source is utilized, and ions are formed of materials comprising compounds having a lower ionization energy than a metal that they contain.

The invention also relates to the generation of ions and ion beam processing of materials and more particularly to new and improved methods and apparatus wherein surface reactions are used to produce molecules which are then ionized in whole or as fragments thereof for forming molecular ion species.

Also, the invention relates to the use of sputtering processes for the generation of gaseous molecules and clusters which are then ionized in whole or as fragments thereof on a surface ion source for forming molecular ion species.

Further, the invention teaches the use of providing acidic oxide layers on an article that forms a contact surface for the production of positive molecular ions and, more particularly, those molecules which contain carbon, such as in the form of hydrocarbons and organometallics.

Still further, the invention provides for the use of titanium, zirconium and hafnium metals as a contact surface for the production of negative ions containing oxygen.

BACKGROUND OF THE INVENTION

Gas phase ions have been useful in a variety of technologies, such as in ion implantation, ion beam assisted deposition, ion beam mixing, surface etching, sputtering, mass spectrographs, submicron lithography, microelectronic circuit fabrication, electronic propulsion devices, magnetohydrodynamic generators and the detection of substances, to name a few.

Ion sources which have been used in the past for ion implantation, particularly for ions of the rare earths, cannot produce high-current, metal-ion beams above about ten milliamperes. These known ion sources also produce a large amount of impurity ions and, therefore, the use of mass analysis is necessary for purifying the ion beam. Such purification processes substantially increase the costs and lower the production rates for finished materials.

Heretofore, a common ion source was one typified as being of the magnetron type. Magnetic fields are featured in many ion source designs to help create stable plasmas and to increase the ionization efficiency of the ions within the source. As a rule, the electrons are held in an oscillating or circulating motion between an anode and cathode until they lose an appreciable part of their energy by excitation or ionization collisions. Subsequently, the electrons reach the anode and thus form the anode current of the source. The ions generated in ionizing collisions, after extraction from this source by an extracting field, form the ion beam current.

In one magnetron type of ion source, referred to as the Harwell-Freeman source, the ion source reaches a temperature of about 1100 degrees centigrade. Thus, refractory metals must be ionized in the form of their volatile chlorides. It is usually essential to use completely anhydrous chlorides for ion source operation. Even small traces of water will prolong the source outgassing and in many cases will result in the conversion of some of the chloride to involatile oxychloride or oxide on heating in vacuum. The polyvalent chlorides present a more serious problem because of the difficulties of chemical synthesis and because many of them are extremely hydroscopic. Most of these chloride vapors are very reactive at elevated temperatures which strongly influence the life and reliability of the constructional components which form the apparatus.

The foregoing known method of ionization has several disadvantages for use in ion implantation, namely, the method produces only a few milliamperes of current; the variety of ionic species formed in this source makes magnetic separation of the beam indispensable thus increasing the costs associated with implantation applications; and many physical parameters intervene in the operation of such a source making it difficult to control and limiting its operational life.

Current Methods In Obtaining High Work Function Materials

In the past, it has been known to use gaseous oxygen to raise the work function of a metal contact surface to form an oxide layer. This oxide layer is often reduced by impinging organic vapors in the process of ionizing organic vapors by surface ionization. This results in the lowering of the work function and thus a decrease in the production of ions.

Current Methods In Obtaining Low Work Function Materials

In the past, it has been known to use coated filaments and ceramic material for obtaining low work function surfaces. However, these surfaces become "poisoned" in oxygen containing atmospheres thereby making it difficult to obtain negative ions containing oxygen, or negative ions in oxygen containing atmospheres.

Current Methods in Electronic Devices Utilizing Surface Ionization Techniques

In the past, it has been known to use cesium as the source material for electronic propulsion using surface ionization. The ionization usually was performed on tungsten surfaces with temperatures greater than 1000° C. The production of cesium ions by such methods requires the use of high current and high energy consumption processes.

It has also been known in the past to use cesium as a source material for use in the production of ions for magnetohydrodynamic generators. Such use, however, is not commercially feasible because of the high cost of cesium.

SUMMARY OF THE INVENTION

The present invention employs surface ionization. The attractiveness of surface ionization resides in its simplicity, particularly in the required apparatus which is generally comprised of an oven, a hot metal surface and an extraction electrode which suffice for the production of quite intense beams of mono-energetic ions. Under high vacuum conditions, on the order of $10^{-5}$ torr, surface ionization ion sources are capable of delivering singularly charged ions with a minimum of impurities and low energy spread. Therefore, the costs and expense of subsequent beam analysis is not required. Furthermore, such an ion beam can be readily controlled over a wide range of current densities and acceleration voltages and the source does not suffer from the beam defocusing effects characteristic of certain discharge sources.

The benefits of the ion source of the present invention can be summarized as follows:

(1) Ion currents are attainable in the range of one ampere;

(2) Long duration of operation, in a range from hundreds to thousands of hours;

(3) Low energy dispersion in the ion beam because energy dispersion is just the thermal effect related to the temperature of the source, and is on the order of about 0.2 electron volts (0.2 eV);

(4) High purity of the ion beam, thus avoiding the need to use magnetic separation before ion deposition or implantation;

(5) Allows for production of a broad, i.e., large in cross-sectional area, ion beam; and (6) Provides the ability for simultaneously implanting metals and non-metals in the form of molecular ions.

The invention has a myriad of uses including providing enhanced wear and corrosion resistance to materials such as lens for timepieces, light transmitting members such as eyeglasses or vehicle windows and windshields, machine tool surfaces, leading edges of turbine blades and aircraft wings and the like, and surfaces subjected to heat, friction and wear such as automobile engine and rocket components. The invention is also useful for modifying the coefficient of friction of surfaces, changing the optical properties of materials, and useful for obtaining high purity substances.

This invention relates to the generation of and ion beam processing of materials and more particularly to new and improved methods and apparatus wherein surface reactions are used to produce molecules which are ionized in whole or as fragments thereof for forming molecular ions. These surface reactions are catalytic type reactions wherein a molecule is formed on a surface and desorbed as an ion or as a neutral to be ionized in whole or in part before being made to come into contact with the substrate.

In general, hydroxide species are capable of forming negative ions on a low work function surface by the loss of a proton from the hydroxide species to the ionizing surface. In this case, the hydroxide species acts as an acid donating a proton to the surface which acts as a base. The stronger the acid strength of the hydroxide the greater the probability of forming negative ions. An example of this type of reaction is:

$$H_2SiO_3 > surface > HSiO_{3(g)}^-$$

Positive molecular ions are capable of being formed by proton transfer from the surface to the adsorbed species. In this case the adsorbed species acts as a base by gaining a proton from the surface which acts as an acid. Examples of these types of reactions are $$UO_3 + H^+_{(surface)} > UO_3H^+_{(g)}$$

and $$H_2SiO_3 + H^+_{(surface)} > H_3SiO_3^+_{(g)}$$

The concentration of H+ on the surface ion source may be increased by the introduction of an acid such as HNO3(g). It is thus possible to greatly increase the ion output from reactions such as $$HNO_{3(g)} + UO_{3(g)} > surface > HUO_{3(g)}^+$$

by the addition of acidic species.

An important object of the invention is the provision of new and novel surfaces for use as contact surfaces in surface ionization processes for the production of positive molecular ions for use in ion beam processing of materials. In the case of positive molecular ion formation these novel surfaces are composed of acidic oxide layers on an article forming a contact surface for obtaining a high work function. The oxide layers may be in the form of oxides of aluminium, boron, beryllium, magnesium, and silicon, and mixtures thereof. These oxides are particularly useful for raising the work function of noble metals, rhenium and tungsten for ionizing carbon containing molecules. In the case of negative ion formation for the production of oxygen containing ions these novel surfaces are composed of the metals having the property of absorbing oxygen into the metal when heated in oxygen containing atmospheres, examples being titanium, zirconium, and hafnium.

Proposed Methods in Electronic Devices Utilizing Surface Ionization Techniques

The invention proposes to use hydroxides in the formation of ions, at low temperatures, i.e., less than 1000° C., and high mass, i.e., greater than 300 atomic mass units, by surface ionization methods for creating a low current, low energy consumption apparatus for electronic propulsion.

Further, the invention proposes to use hydroxides in the formation of ions for producing a high ion output at low cost. The production of a high output low cost ions would make the generating of electricity by magnetohydrodynamic generators cost effective. The generation electricity by this method is accomplished by for by forcing ionized molecules through a transverse magnetic field. This method not only will reduce costs but will allow for greater control of output.

BRIEF DESCRIPTION OF THE DRAWINGS

FIG. 1 schematically illustrates apparatus, partly in section, for generating ions in accordance with the present invention.

FIG. 2 is a fragmentary view of a portion of a surface ion source according to one form of the invention.

DETAILED DESCRIPTION OF THE INVENTION

The performance of a surface ionization ion source depends mainly on the nature and shape of the emitting surface. In order to obtain a high ionic current, the emitting surface must present a large surface area and allow a high vapor flow rate over or through it. To achieve this, different types of surface ion sources were designed, namely, (1) a sheet, or flat metal surface, and (2) a porous surface ion source, which may be either a porous wire cloth, such as a screen, or a porous powder compact, such as a sintered body. However some metals, rhenium being one example, recrystallize at a lower temperature than needed to obtain a space charge limited current, so that sintered powder compacts may not be appropriate in such instances; accordingly, at the present time, the preferred surface ion source utilized with the present invention is a wire cloth. This is particularly true for ionization processes of inorganic molecules. The use of wire cloth offers a number of advantages for the construction of porous ionizers. Among the benefits would be that of producing large surfaces possessing a high degree of uniformity and dimensional stability. Also, large surface ionizers can be constructed at favorable costs. Further, the use of wire cloth for forming the surface ion source has the advantage that it can be readily heated by using resistance heating apparatus.

Ionization of an atom or molecule at the surface of a metal will proceed in three discrete steps. First, the atom or molecule, while approaching the surface of the metal will be polarized by the image forces between its nucleus and the free electrons inside the metal. The atom will adhere to the surface under the action of these forces. In the second step, the adsorbed atom, or molecule, has a probability of making a transition from a neutral state to an ionic state. This will occur, in the case of positive surface ionization, if the work function of the metal is greater than the ionization energy of the atom or molecule; in the case of negative surface ionization, if the work function of the surface is lower than the electron affinity of the atom or molecule. The third step will occur only if the temperature of the surface is high enough to make the ions desorb; that is, if the temperature is sufficiently high, the adsorbed ions will accumulate enough energy to overcome the binding forces, and the ions will leave the surface. The control of the emerging ion beam can be exercised by suitable electrodes.

This model of the ionization process infers that the ion input per unit of surface area (i.e., the current density) of a surface ion source is a function of various parameters: first, the difference between the work function of the surface and the ionization energy or the electron affinity of the impinging atoms or molecules; second, the sitting, or resident, time of the adsorbed ions, this being a function of the surface temperature and the binding force between the ions and the surface; third, in the case of molecular ion formation on the surface, the surface coverage and the enthalpy of formation; fourth, space charge effects; and fifth, the structure of the ion source.

Thus, the invention contemplates a method of forming ions, the method comprising the steps of: heating a catalytic surface; impinging gas phase material upon the catalytic surface for adsorbing at least part of the gas phase material thereon; reacting the adsorbed material on the catalytic surface for forming products; desorbing the products from the catalytic surface in the form of gaseous product material; and ionizing the gaseous product material for forming ionized molecules by use of a surface ion source.

In the field of molecular ions it is often difficult or impossible to determine the ionization energy or electron affinity of the molecule that formed the ion. The $H_3$ molecule does not occur in nature and therefore the ionization energy of a $H_3$ molecule can not be determined. Thus, use is often made of "proton affinities" in order to determine the probability of forming ions by reactions such as:

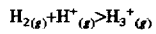

$$H_{2(g)} + H^+_{(g)} > H_3^+_{(g)}$$

These reactions are acid-base type reactions. In the definition given by Lowery and Bronsted, an acid is a proton donor and a base is a proton acceptor.

Acid-base type reactions can occur on surfaces with the subsequent desorption of a molecular ion. In the present case, these types of reactions may involve hydroxide species.

Further, the invention contemplates the use of hydroxides in the formation of ions to produce a high current at low cost and for generating electricity by forcing the ionized molecules through a transverse magnetic field. This method not only will reduce costs but will allow for greater control of output.

High Work Function Materials Useful for the Production of Positive Molecular Ions High work function materials useful for the production of molecular ions can be produced by the oxidation of aluminum, boron, beryllium, magnesium, silicon, and mixtures thereof on metal surfaces such as noble metals, rhenium and tungsten. In the present invention these layers are formed on the surface from one to several monolayers in thickness. This provides for a high work function contact surface useful for the production of molecular ions, particularly carbon containing molecules.

Low Work Function Materials Useful For The Production Of Negative Molecular Ions Low work function materials useful for the production of negative ions in the presence of oxygen containing atmospheres can be obtained by the use of metals having the property of absorbing oxygen into the metal when heated in oxygen containing atmospheres. In particularly useful metals that have this property are titanium, zirconium and hafnium.

The Production Of Molecular Ions From Hydroxide Species By Proton Transfer Reacting On Surfaces Hydroxide species are capable of forming negative ions on a low work function surface by the lows of a proton from the hydroxide species to the low work function which acts as a base. Examples of these types of surface reactions are the loss of a proton from $H_2SiO_3$ to form $HSiO_3^-$ negative ions on a titanium surface and the loss of a proton from $HCrO_3$ to form $CrO_3^-$ negative ions on zirconium.

Positive ions can be formed by proton transfer reactions involving the transfer of a proton from the surface to a oxide or hydroxide species. In this case the surface acts as an acid and the proton receiving species the base. Examples of these types of surface reactions are the gain of a proton by $H_2SiO_3$ to from $H_3SiO_3^+$ on a oxidized rhenium surface exposed to $HNO_{3(g)}$ and the gain of a proton by $UO_3$ to form $UO_3H^+$ on a oxidized platinum-iridium alloy surface exposed to and acid.

The ionization energies of many of these hydroxide species are sufficiently low (less than 4.5 eV for $UO_3H$) to form a high output of ions useful in electronic propulsion and magnetohydrodynamic generators. In addition many of the species produced by proton transfer to the surface have high electron affinities (greater than 5.0 eV) to form a high output of negative ions useful for electronic propulsion.

The Production Of Molecular Species By Sputtering Processes

Catalytic methods for the production of gas phase molecular species to be deposited upon a surface ion source are limited in the control of the flow rate and types of molecules produced. The present invention contemplates the process of sputtering a solid source material, such as borides, oxides, carbides, elements in their solid state and alloys for producing gas phase matter and impinging it upon a contact surface for forming molecular ions.

The Catalytic Production Of Atomic And Molecular Species

In general, catalytic processes can be divided into two types:

1. Dissociation of gas phase matter in the form of molecules for forming gaseous product material in the form of atomic species; and
2. Associative reactions wherein the products of adsorption of gas phase material are reacted to form molecular species that desorb from the solid, i.e., catalytic, surface.

In the present invention, it is preferred that the metals of rhenium and the noble metals be used as the contact surface, that is, the catalytic surface.

More information on catalytic production of molecules is disclosed in my U.S. Pat. No. 5,420,437 and in my co-pending U.S. application Ser. No. 08/452,487 respectively filed on May 30, 1995 and entitled "Method And Apparatus For Making And Depositing Compounds", the disclosure of which is incorporated herein by reference.

DETAILED DESCRIPTION OF THE DRAWING

The drawing illustrates an ionization apparatus, generally indicated by the numeral 10, which includes a surface ion source 12 shown as being in the form of a wire metal screen; the surface ion source 12 may also be in the form of a tube, or bundle of wires or a porous powder compact, and the like. It is a particular feature of the invention that the choice of materials for ion source 12 determines very important differences in the operation thereof. In one form of the invention, surface ion source 12 is formed of essentially pure rhenium, whether in the form of a wire screen or a porous, sintered powder compact, etc., to provide for positive surface ionization. When it is desired to perform negative surface ionization, ion source 12 needs to be in the form of a grid, or plate, or compact, etc., which is provided with a low work function surface; a low function work surface can be provided by using coatings or coverings, or articles of, for example, coatings of barium oxide on tungsten, lanthanum boride or thoriated tungsten.

A mixing chamber, generally indicated by the numeral 14, may include a heat source 16 for vaporizing a substantially purified starting material 18 such as a metal. Starting material 18 may be vaporized in a crucible 20 by heat source 16 operating at a sufficiently high temperature so that vapors thereof, indicated by the arrows 22, enter into an upper portion or plenum 24, of chamber 14, wherein the vapors 22 may be mixed with one or more reactants in the form of gas phase material, indicated by the arrows 26, introduced through one or more valves 28. Mixing chamber 14 and plenum 24 are shown in the drawing as being divided by plate 27 which includes an aperture 29 for allowing vapors 22 to pass therethrough; it is to be understood that plate 27 may be omitted, if desired. Further, it is to be understood that the heat source 16 is not needed when the reactants for any particular process are all introduced in gaseous form, such as through one or more valves 28.

In one form of the invention, the reactant gas, or gases, 26 is purified oxygen which, together with vapors 22, flow through a tortuous passageway, generally indicated by the numeral 30. In one form of the invention, tortuous passageway 30 is defined by a surface catalyzer member 31 which contains, or is comprised of, a plurality of small-dimensioned tubes 32 formed of substantially pure rhenium, or noble metals; in another form, surface catalyzer member 31 may be formed by or contain a plurality of plates, or sheets, also preferably formed of substantially pure rhenium or noble metals. The purpose and function of tortuous passageway 30, through surface catalyzer member 31, is to assure that the atoms or molecules of vapors. 22 and reactant gas, or gases, 26 impinge upon the walls of the catalyzer member 31 formed of plates, or sheets, or tubes 30, which act as a catalyzer means for catalytically forming or creating molecules. Any adsorption of vapors 22 and reactant gas 26 upon the plates, sheets or tubes 30, of catalyzer member 31, will create an adsorbed phase-vapor phase interface; a vaporizer heater 34 is provided, and is shown as being comprised of, for example, a rf-coil, or resistance-coil 36 which extends along a feed chamber 38 substantially the full length thereof from the plenum 24 up to the surface ion source 12. Heater 34, which is used to heat the plates, or sheets, or tubes 30, of catalyzer 31 to a temperature in the range of about 500° K. to about 2800° K., is shown as being contained within an insulative heat shield 40.

It is to be understood that the molecules to be ionized may be selected from the group consisting of rare earths, monovalent alkaline earths, and the monoxides of the alkaline earths, species of titanium and zirconium, the divalent and tetravalent species of uranium, the organo-metallics, oxides or hydroxides in the form of $M_xO_yH_z$, where M is a metal or nonmetal such as uranium, chromium, molybdenum, tungsten, phosphorous, boron and silicon. These hydroxides are formed on the surface catalyzer 31 by the reaction of these metals, or non-metals, with oxygen and hydrogen contained within gaseous matter which can be introduced through valve 28 for forming the reactant gas 26 and is impinged upon the catalytic surface 31 along with vapors 22.

As previously described, surface ion source 12 may be heated by resistance heating, for example, through use of an electric circuit (not shown). A voltage on the order of one kilovolt or greater applied to the surface ion source 12 is to operate at a temperature at or above that of the surface catalyzer 31 to ensure the production of molecular ions greater than one milliampere for creating a high current density. It will be understood that the upper temperature of the surface ion source 12 must be less than the melting point of the material of which it is composed.

A beam-forming electrode 42 is provided adjacent to surface ion source 12 on the side thereof remote from the feed chamber 38 for causing ions to be driven, extracted, drawn or expelled from source 12 in the form of an emerging ion beam 44. An acceleration electrode 46 and a deceleration electrode 48 are provided to control ion beam 44 so that the ions impinge upon a substrate 50 with a desired velocity and across a desired area greater than $10^{15}$ ions per square centimeter for forming an ion layer 52. It will be understood that ion layer 52 may be created by a plurality of ions being deposited upon the surface of substrate 50; likewise, it will be understood that ion layer 52 may be created by a plurality of ions being implanted into the material of substrate 50 by imparting sufficient energy to ion beam 44 so that the individual ions reach the surface of substrate 50 with the required velocity for causing implantation rather than mere surface deposition.

It is to be understood that the invention further comprises the use of ion beam 44 for providing electronic propulsion, for example, in the form of an ion motor. In one particular form, the ion beam 44 can be formed of ions of $UO_3H^+$. $UO_3H$ has an ionization energy of less than 4.0 electron volts and the ions desorb at a temperature below 1,000 degrees C. These characteristics make this heavy molecule especially useful for ion propulsion and ion beam weapons.

Another form of the invention comprises the ion beam 44 being passed through a mass analyzer (not shown) for separating ionized molecules by differences in their respective masses for separation of isotopes.

Ionization apparatus 10 is operated within an enclosed pressure chamber, or compartment, or room, or other form of enclosure, generally indicated by the numeral 60. Chamber 60 is evacuated to a pressure level on the order of lower than $10^{-5}$ torr by one or more high velocity vacuum pumps 62, which may be, for example, turbomolecular vacuum pumps; a vacuum of this magnitude will allow quite satisfactory performance of the ionization process and operation of the ionization apparatus 10 which comprise the present invention and will avoid arcing problems that occur at higher pressures.

A second valve 70, similar to first valve 28, provides a second inlet for introducing gaseous matter into the feed chamber 38 for mixing with the atoms and molecules flowing therethrough. Gas introduced through valve 70 is usually oxygen, and is particularly used whenever hydrogen, halogens, or pseudo-halogens, or mixtures thereof with oxygen, are introduced through valve or valves 28 and used for forming protonated oxyacids, halides or oxide ions. This additional supply of oxygen through valve 70 is used with the halogens for the purpose of raising the work function of the surface ion source 12. Further, such oxygen is very useful for removing impurities, typically molybdenum and tantalum, from the rhenium wire screen of surface ion source 12 as well as removing these impurities from the gas phase materials 18 and/or 26.

The foregoing description is directed to preferred embodiments of the present invention and to the presently contemplated best mode of apparatus and process steps for performing the invention. It is, of course, understood that various modifications and changes may be made without departing from the spirit and scope of the invention which are to be determined in accordance with the following claimed subject matter.

I claim:

1. Apparatus for generating ions, said apparatus comprising container means for containing material to be ionized, vaporizing means for vaporizing said material, a mixing chamber and a passageway connected thereto for transporting said vaporized material from said container and through said mixing chamber, means for introducing reactant means into said mixing chamber and said passageway for creating molecules having a high electron affinity, a surface ion source located downstream of said passageway for ionizing said molecules, and means for causing said ionized molecules to emerge from said surface ion source.

2. Apparatus as defined in claim 1 wherein said passageway is defined by surface catalyzer members formed from the group consisting of rhenium and the noble metals.

3. Apparatus as defined in claim 1 wherein said surface ion source is formed of metals having the property of absorbing oxygen into the metal when heated in an oxygen containing atmosphere.

4. Apparatus as defined in claim 1 further including a plenum located between said container means and said passageway, and means for introducing into said plenum a gas selected from the group consisting of oxygen, the halogens, and hydrogen.

5. Apparatus as defined in claim 1 wherein said means for causing said ionized molecules to emerge from said surface ion source includes means for extracting a current output from said surface ion source greater than one milliampere of molecular ions.

6. A method of forming ions, said method comprising the steps of: heating a catalytic surface; impinging gas phase material upon said surface for adsorbing at least part of said gas phase material thereon; reacting the adsorbed material on said surface for forming products; desorbing said products from said surface in the form of gaseous product material; and ionizing said gaseous product material for forming ionized molecules by use of a surface ion source.

7. A method as defined in claim 6 further including the step of forming said ionized molecules into an ion beam.

8. A method as defined in claim 7 further including the step of extract said ion beam for forming a current in excess of one milliampere.

9. A method as defined in claim 8 further including the step of using said ion beam for ion beam processing of material.

10. A method as defined in claim 9 further including the step of processing material with at least $10^{15}$ ions per square centimeter.

11. A method as defined in claim 6, further including the step of selecting said gas phase material for forming gaseous product material at least some of which are atomic.

12. A method as defined in claim 6, further including the step of selecting said gas phase material for forming said gaseous product material at least some of which are molecular.

13. A method as defined in claim 6, further including the step of providing said surface ion source having a low work function material for forming negative molecular ions.

14. A method as defined in claim 6, further including the step of providing said surface ion source having a high work function material for forming positive molecular ions.

15. A method as defined in claim 6 wherein said gas phase material is selected from the group consisting of uranium, chromium, molybdenum, tungsten, phosphorous, boron and silicon.

16. A method as defined in claim 15 further including the step of impinging matter comprised of oxygen and hydrogen upon said catalytic surface with said gas phase material for forming hydroxides having the form of $M_xO_yH_z$.

17. A method as defined in claim 6 further including the step of forming an ion beam of said ionized molecules for use in electronic propulsion.

18. A method as defined in claim 6 further including the step of forming an ion beam of said ionized molecules and separating said ionized molecules according to their respective masses for separation of isotopes.

19. A method as defined in claim 6 further including the step of forcing said ionized molecules through a transverse magnetic field for generating electricity.

20. A method of ion beam processing of materials, said method comprising the steps of: heating a contact surface; impinging gas phase matter upon said surface for adsorbing at least part of said gas phase matter thereon; reacting the adsorbed matter on said surface for forming products at least some of which are molecular ions; desorbing said molecular ions from said surface; forming an ion beam with said molecular ions, and processing said material with said ion beam.

21. A method as defined in claim 20, further including the step of providing said contact surface in the form of a low work function material for forming negative molecular ions.

22. A method as defined in claim 20, further including the step of providing said contact surface in the form of a high work function material for forming positive molecular ions.

23. A method as defined in claim 20 further including the step of extract said ion beam for forming a current in excess of one milliampere.

24. A method as defined in claim 23 further including the steps of: providing an article having a high work function material, and contacting said article with molecules containing carbon for forming positive molecular ions containing carbon.

25. A method as defined in claim 20 further including the step of using said ion beam for ion beam processing of material.

26. A method as defined in claim 25 further including the step of processing material with at least $10^{15}$ ions per square centimeter.

27. A method as defined in claim 20 further including the step of producing said gas phase matter by sputtering a solid source material.

28. A method as defined in claim 27 further including the step of selecting said solid source material from the group consisting of borides, oxides, carbides, elements in their solid state and alloys.

29. A process for obtaining a high work function contact surface for the positive surface ionization of molecules, said process comprising the steps of: providing an article formed of materials selected from the group consisting of noble metals, rhenium and tungsten and including a contact surface, forming upon said article an acidic oxide layer selected from the group consisting of oxides of Al, B, Be, Mg, Si and mixtures thereof, and using said article as an emitter for positive molecular ions.

30. A process as defined in claim 29 wherein said acidic oxide layer is selected to be aluminum oxide, and said article is selected to be rhenium.

* * * * *